United States Patent [19]
Park

[11] Patent Number: 5,447,879
[45] Date of Patent: Sep. 5, 1995

[54] METHOD OF MANUFACTURING A COMPACTOR IN A SEMICONDUCTOR MEMORY DEVICE HAVING A TFT TRANSISTOR

[75] Inventor: Sung Wook Park, Kyungki, Rep. of Korea

[73] Assignee: Hyundai Electronics Industries Co., Ltd., Kyungki, Rep. of Korea

[21] Appl. No.: 266,357

[22] Filed: Jul. 1, 1994

[30] Foreign Application Priority Data

Jul. 2, 1993 [KR] Rep. of Korea ............ 93-12364
Jul. 2, 1993 [KR] Rep. of Korea ............ 93-12365
Jul. 2, 1993 [KR] Rep. of Korea ............ 93-12366

[51] Int. Cl.⁶ .................. H01L 21/70; H01L 27/00
[52] U.S. Cl. ........................ 437/52; 437/47; 437/60; 437/919
[58] Field of Search ............ 437/47, 52, 60, 919; 257/304–308, 311

[56] References Cited

U.S. PATENT DOCUMENTS

| | | | |
|---|---|---|---|
| 4,412,375 | 11/1983 | Matthews | 437/45 |
| 5,158,905 | 10/1992 | Ahn | 437/52 |
| 5,173,753 | 12/1992 | Wu et al. | 257/347 |
| 5,219,779 | 6/1993 | Suzuki | 437/52 |
| 5,250,828 | 10/1993 | Honma | 257/308 |

FOREIGN PATENT DOCUMENTS 175453  7/1993  Japan .

Primary Examiner—Olik Chaudhuri
Assistant Examiner—H. Jey Tsai
Attorney, Agent, or Firm—Pennie & Edmonds

[57] ABSTRACT

A method of manufacturing a semiconductor memory device is disclosed. A gate region which is used as a word line is formed on a semiconductor substrate and then a TFT is formed on the gate region. Accordingly, the word line is isolated to a bit line and a charge storage electrode, respectively.

9 Claims, 2 Drawing Sheets

METHOD OF MANUFACTURING A COMPACTOR IN A SEMICONDUCTOR MEMORY DEVICE HAVING A TFT TRANSISTOR

FIELD OF THE INVENTION

The invention relates to a method of manufacturing a semiconductor memory device using a TFT(Thin Film transistor), and more particularly, to a method of manufacturing a semiconductor memory device wherein a gate region is formed on a semiconductor substrate, and thereby removing a short phenomena between a bit line and a charge storage electrode.

INFORMATION DISCLOSURE STATEMENT

Generally, as the integration of a DRAM(Dynamic Random Access Memory) in the prior art has increased, the distance between a bit line contact and a word line as well as the distance between a charge storage capacitor contact and a bit line or a word line decrease rapidly, thereby causing a short phenomena between such contacts and lines.

Hence, process margins decrease since contact formation requires the fine control of the alignment tolerance. The leakage current is generated between a diffusion region under a charge storage electrode and a semiconductor substrate as well as between diffusion regions under charge storage electrodes. As the integration of DRAMS has increased, such leakage current has also increased.

Therefore, it is an object of the present invention to solve the problems set forth in the prior art.

It is a further object of the present invention to provide a method of manufacturing a semiconductor memory device wherein a gate region which is used as a word line is formed on a semiconductor substrate and then a TFT is formed on the gate region so that the word line is isolated to the bit line contact and a charge storage capacitor contact, respectively.

SUMMARY OF THE INVENTION

A method of manufacturing a semiconductor memory device according to the present invention for achieving the above objects and other advantages is comprised the following process:

Forming an isolation layer on a semiconductor substrate and then forming a gate region on a desired portion of the semiconductor substrate by the ion implantation method;

Forming a gate insulating layer on the isolation layer and the gate region and then depositing polysilicon on the gate insulating layer;

Forming an active region by etching a desired portion of the polysilicon;

Arranging a photo mask on the active region with a desired width and then forming a source region(or a drain region) on the active region by the ion implantation method;

Removing the photo mask and then forming a first insulating layer on the active region;

Forming a first contact hole by etching a desired portion of the first insulating layer;

Filling a first conductor materials on the first contact hole and forming a bit line by patterning the first conductor materials with a desired width;

Forming a second insulating layer on the first insulating layer and the bit line and then forming a second contact hole by etching the first insulating layer and the second insulating layer with a desired width;

Filling a second conductor materials on the second contact hole and forming a charge storage electrode by patterning the second conductor materials with a desired width; and Sequentially forming a capacitor insulating layer and a plate electrode on the charge storage electrode.

According to the present invention, polysilicon which is formed on the gate insulating layer may be singly crystallized by the annealing process.

BRIEF DESCRIPTION OF THE DRAWINGS

For a fuller understanding of the nature and object of the invention, reference should be made to the following detailed description taken in conjunction with the accompanying drawings in which.

Similar reference characters refer to similar parts through out the several views of the drawings.

DETAILED DESCRIPTION OF THE INVENTION

Figure 1:
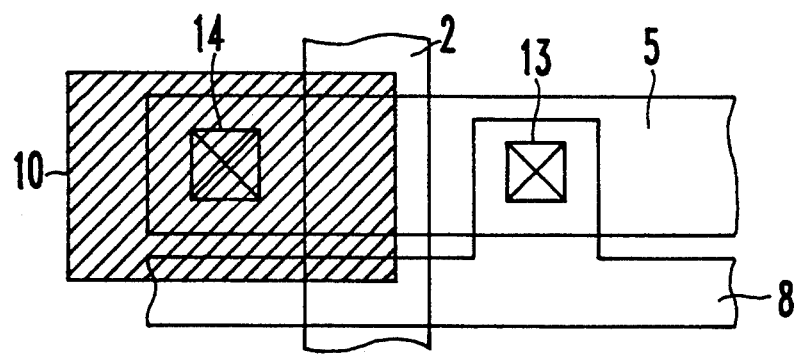
FIG. 1 illustrates a lay-out for manufacturing a semiconductor memory device according to the present invention.

FIG. 1 illustrates a lay-out for manufacturing a semiconductor memory device according to the present invention.

A word line 2, a bit line 8 and a charge storage electrode 10 are illustrated in FIG. 1. A bit line contact region 13 shows a portion which is connected to a drain region. A charge storage electrode region 14 shows a portion through which a charge storage electrode 10 and a source region is connected to each other. An active region 5 shows a portion which is operated as a thin film transistor.

FIG. 2A through FIG. 2D illustrate cross sectional views showing the process of manufacturing a semiconductor memory device according to the present invention.

Figure 2A:
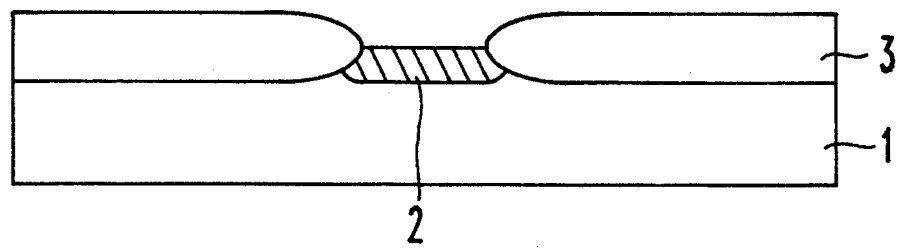
FIGS. 2A through 2D illustrate cross sectional views showing the process of manufacturing a semiconductor memory device according to the present invention.

Referring to FIG. 2A, an isolation layer 3 is formed on a semiconductor substrate 1 and then a gate region 2 is formed on the semiconductor substrate 1 by the ion implantation method. Here, the isolation layer 3 is used to a mask. The gate region 2 must have a low resistance since the gate region 2 is used to a word line as shown in FIG. 2.

Figure 2B:
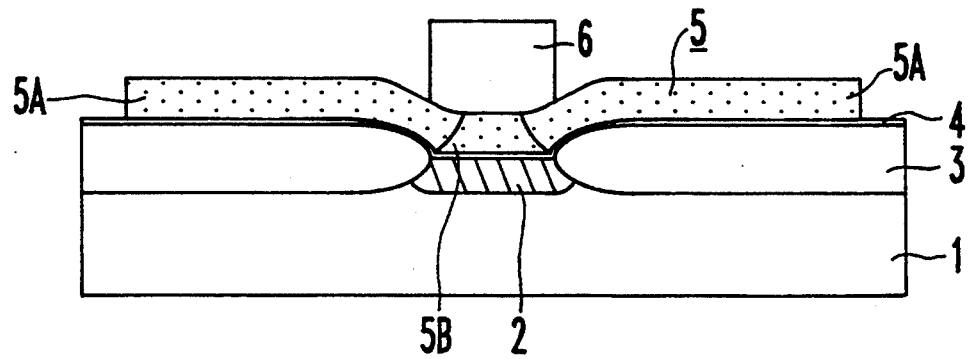
Figure 2C:
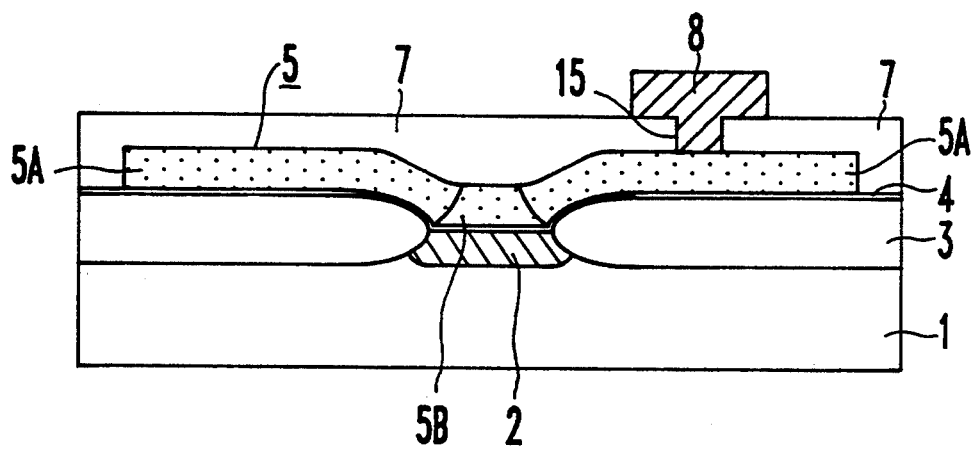

Referring to FIG. 2B, a gate insulating layer 4 is formed on the gate region 4 and the isolation layer 3 by the thermal oxidation process or the chemical vapor deposition process and then polysilicon is deposited on the gate insulating layer 4. An active region 5 is formed on the gate insulating layer 4 by etching a desired portion of the polysilicon. In order to control the threshold voltage, an impurity ion is implanted on the active region 5. A photo mask 6 is arranged on a desired portion of the active region 5 with a same width as that of the gate region 2. A source region(or a drain region) 5A is formed on the active region 5 by the ion implantation method. A portion of the active region 5 under the photo mask 6 is operated as a channel region 5B of a TFT.

On the other hand, the polysilicon which is formed on the gate insulating layer 4 may be singly crystallized.

Referring to 2C, the photo mask 6 is removed and then a first insulating layer 7 is formed on the active region 5. A first contact hole 15 is formed on the first insulating layer 7 by etching a desired portion of the first insulating layer 7. The first contact hole 15 is filled with a first conductor materials and then a bit line 8 is formed by patterning the first conductor materials.

Figure 2D:
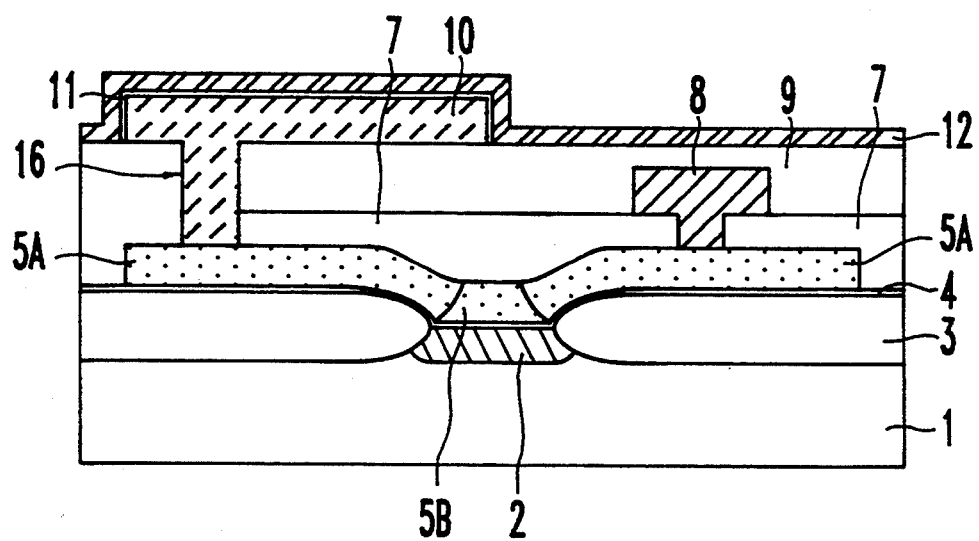

Referring to FIG. 2D, a second insulating layer is formed on the bit line 8 and the first insulating layer 7 and then a second contact hole 16 is formed by etching a desired portion of the first insulating layer 7 and the second insulating layer 8. The second contact hole 16 is filled with a second conductor materials and then a charge storage electrode 10 is formed by patterning the second conductor materials. A capacitor insulating layer 11 and a plate electrode 12 are sequentially formed on the charge storage electrode 10.

As described above, a gate region which is used as a word line is formed on the semiconductor substrate and then a TFT is formed on the gate region, and then the word line is isolated to a bit line and a charge storage capacitor respectively. Accordingly, a short phenomena between a bit line and a charge storage electrode is removed.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a semiconductor memory device, which comprises of:
    forming an isolation layer on a semiconductor substrate and then forming a gate region in a portion of said semiconductor substrate by the ion implantation method;
    forming a gate insulating layer on said isolation layer and said gate region and then depositing a polysilicon layer on said gate insulating layer;
    forming an active region by etching a portion of said polysilicon layer;
    arranging a photo mask on said active region and then forming source and drain regions on said active region by the ion implantation method;
    removing said photo mask and then forming a first insulating layer on said active region;
    forming a first contact hole by etching a portion of said first insulating layer;
    filling a first conductor in said first contact hole and forming a bit line by patterning said first conductor material;
    forming a second insulating layer on said first insulating layer and said bit line and then forming a second contact hole by etching said first insulating layer and said second insulating layer;
    filling a second conductor material in said second contact hole and forming a charge storage electrode by patterning said second conductor material; and
    sequentially forming a capacitor insulating layer and a plate electrode on said charge storage electrode.

2. The method of claim 1, wherein said polysilicon layer on said active region is singly crystallized by the annealing process.

3. The method of claim 1, wherein said gate insulating layer is formed by the thermal oxidation process.

4. The method of claim 1, wherein said gate insulating layer is formed by the chemical vapor deposition process.

5. The method of claim 1, wherein an impurity ion is implanted on said active region in order to control the threshold voltage.

6. A method of manufacturing a semiconductor memory device, which comprises of:
    forming an isolation layer on a semiconductor substrate and then forming a gate region in a portion of said semiconductor substrate by the ion implantation method;
    forming a gate insulating layer on said isolation layer and said gate region and then depositing a polysilicon layer on said gate insulating layer;
    forming an active region by etching a portion of said polysilicon layer;
    implanting impurity ions on said active region in order to control the threshold voltage;
    arranging a photo mask on said active region and then forming on said active region by ion implantation;
    removing said photo mask and then forming a first insulating layer on said active region;
    forming a first contact hole by etching a portion of said first insulating layer;
    filling a first conductor in said first contact hole and forming a bit line by patterning said first conductor material;
    forming a second insulating layer on said first insulating layer and said bit line and then forming a second contact hole by etching said first insulating layer and said second insulating layer;
    filling a second conductor material in said second contact hole and forming a charge storage electrode by patterning said second conductor material; and
    sequentially forming a capacitor insulating layer and a plate electrode on said charge storage electrode.

7. The method of claim 6, wherein said polysilicon on said active region is singly crystallized by the annealing process.

8. The method of claim 6, wherein said gate insulating layer is formed by the thermal oxidation process.

9. The method of claim 6, wherein said gate insulating layer is formed by the chemical vapor deposition process.

* * * * *